United States Statutory Invention Registration [19]

[11] Reg. Number: H965

Davis et al. [43] Published: Sep. 3, 1991

[54] DIFFERENTIAL AMPLIFIER WITH DIGITALLY CONTROLLED GAIN

[75] Inventors: Paul C. Davis, Reading; Scott L. Forgues, Wyomissing; Iconomos A. Koullias, West Lawn, all of Pa.

[73] Assignee: American Telephone and Telegraph Company, New York, N.Y.

[21] Appl. No.: 471,185

[22] Filed: Jan. 26, 1990

[51] Int. Cl.[5] ..... H03F 3/45

[52] U.S. Cl. ..... 330/254; 330/283; 307/299.2

[58] Field of Search ..... 330/254, 283; 307/299.2

[56] References Cited

U.S. PATENT DOCUMENTS 4,378,528 3/1983 Harford ..... 330/283 X

FOREIGN PATENT DOCUMENTS 2037695 2/1972 Fed. Rep. of Germany ..... 330/254
3522416 1/1987 Fed. Rep. of Germany ..... 330/254
138910 10/1980 Japan ..... 330/254

OTHER PUBLICATIONS

Bardell, Jr. et al., "Three-Level Inverter Using a Two-Emitter Transistor", *IBM Technical Disclosure Bulletin*, vol. 4, No. 3, Aug. 1981; p. 80.

Millican, "Four-Level Gain Control Stage", *IBM Technical Disclosure Bulletin*, vol. 14, No. 9, Feb. 1972, pp. 2639, 2640.

"Digital Gain Control Wins OP Amp A Niche in Microprocessor Systems," *The Handbook of Linear IC Applications*, 1987 pp. 85 through 89.

*Primary Examiner*—Linda J. Wallace

*Attorney, Agent, or Firm*—Scott W. McLellan

[57] ABSTRACT

Differential amplifier having multiple stages, each stage having the gain thereof set by digital control. The gain of each stage is individually controlled, thereby allowing wide dynamic range and gain. Each stage has a differential pair with multiple sets of gain-setting resistors in the emitters of the pair. By selecting which resistor set, or combination of resistor sets, is used, the gain of the stage is controlled. The result is a 4 stage, 0–45 dB gain amplifier for RF or IF applications, with the gain adjustable in 3 dB increments.

8 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FROM DIGITAL CONTROL 12 (FIG.1)

DIFFERENTIAL AMPLIFIER WITH DIGITALLY CONTROLLED GAIN

BACKGROUND OF THE INVENTION

1. Field of the Invention

This invention relates to gain-controlled amplifiers in general and, more particularly, to gain-controlled amplifiers having cascaded gain stages.

2. Description of the Prior Art

Amplifiers having variable gain are used in a variety of applications, such as in instrumentation, where selectable and precise gain control may be needed. Another application is in a superheterodyne radio receiver, where most of the gain in the receiver is provided by an intermediate-frequency (IF) amplifier. For the receiver to be useful in practical applications, it is usually desirable to have the receiver successfully process signals with widely differing intensities. In other words, the receiver should be designed to handle the largest possible difference in signal strength between the weakest received signal that can be utilized and the largest received signal before overload occurs. This is referred to as the dynamic range of the receiver. To increase the dynamic range, the receiver's IF amplifier is usually adapted to be responsive to a means for controlling the gain so that weak signals are amplified sufficiently for intelligibility while strong signals do not overload subsequent circuitry. An example of a controlling means in a typical radio receiver is a peak detector coupled to the output of the IF amplifier. The peak detector samples the output of the IF amplifier to provide an analog gain control signal that is fed back to the IF amplifier. The stronger the received signal, the larger the output of the IF amplifier and the gain control signal varies accordingly to reduce the gain of the IF amplifier. Similarly, when the received signal is reduced, the output of the IF amplifier decreases and the gain control signal reacts accordingly to increase the gain of the IF amplifier. The variation in IF amplifier gain may be as large as 50 to 100 dB, increasing the receiver's dynamic range accordingly.

As known in the prior art, the generation of the control signal may be derived directly from the peak detector or may be generated from a digital control system, such as a microprocessor or a digital signal processor. To create the analog gain control signal from a digital one, a digital-to-analog converter (DAC) is used to convert the digital data from the microprocessor into an analog signal. This makes the receiver more expensive considering the inclusion of a DAC either as a separate device or as part of the IF amplifier or microprocessor. Further, the analog gain control signal does not have a linear correspondence to the gain; "kinks" or nonlinearities exist in the voltage-to-gain curves of the analog gain control signal for the IF amplifier. Further, the voltage-to-gain curves may vary with temperature. The "kinks" and other variations may have to be compensated for in the microprocessor software if precise gain control is to be achieved.

An alternative approach for microprocessor controlled receivers is having multiple gain stages, each with fixed gain, which are switched in or out of the signal path depending on the desired overall IF gain. This approach requires multiple switches, typically one per gain stage, each switch being as or more complex than the corresponding gain stage. This also increases the cost of the receiver by approximately doubling the cost of the IF amplifier therein.

SUMMARY OF THE INVENTION

It is therefore one aspect of the invention to provide an amplifier with variable gain directly controllable by a digital control system.

It is a further aspect of the invention to provide a variable gain amplifier with precise control over the gain thereof by digital means.

It is a still further aspect of the invention to provide a variable gain amplifier having a power-down state and allow for fast recovery upon being turned on.

These and other aspects of the invention are provided for generally by an amplifier having a plurality of gain stages connected in tandem, the gain of each stage being controlled by digital input signals, each gain stage characterized by: at least one transistor having multiple emitters; a plurality of resistors, coupling to corresponding emitters; and, means, coupling to the plurality of resistors, for enabling current through selected ones of the plurality of resistors in response to the digital input signals. The gain of the gain stage is substantially determined by the resistances of the plurality of resistors having current flowing therein.

The above aspects are further provided for generally by a differential amplifier having differential inputs, differential outputs, and digitally selectable gain, characterized by first and second transistors, each having an input and first and second outputs, the inputs coupling to corresponding differential inputs of the gain stage and first outputs coupling to differential outputs of the gain stage; first and second load resistors having substantially equal resistances, coupling to corresponding collectors of first and second transistors; at least two pairs of gain-setting resistors having substantially equal resistances, each resistor of the pair coupling to corresponding second outputs of the first and second transistors, for setting the gain of the gain stage; and, switched current sources for selectively conducting current from the corresponding pair of gain-setting resistors; wherein the gain of the stage is determined substantially by the ratio of the resistance of the load resistors to the combined resistance of the gain-setting resistors having current therein.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
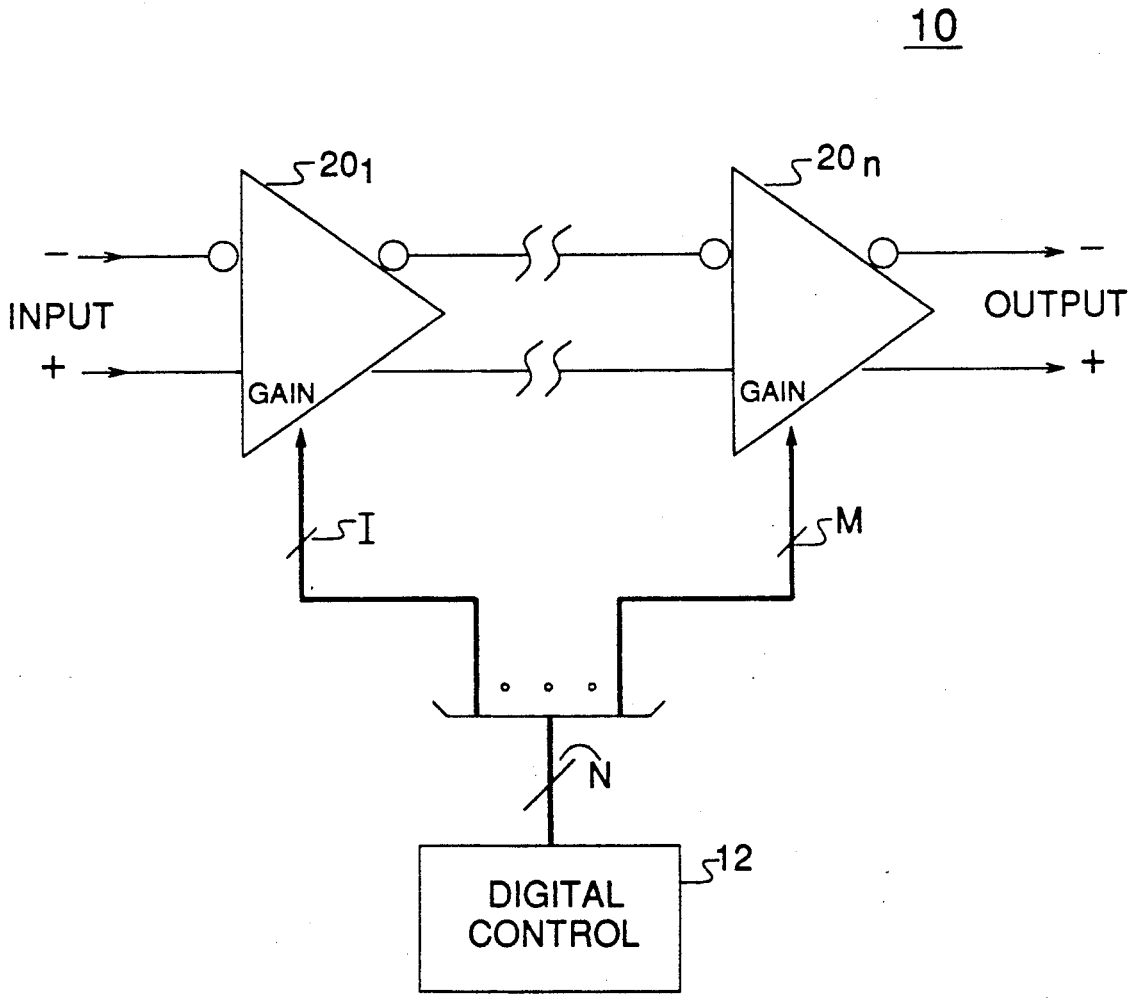
FIG. 1 is a diagram of a differential amplifier having digitally controlled gain.

In FIG. 1, a differential amplifier 10 having digitally controlled gain is shown, useful in RF and IF amplifiers or any application where digitally controlled, variable gain is needed. The amplifier 10 has a plurality of gain stages $\mathbf{20_1}$–$\mathbf{20_n}$, each stage being responsive to digital data to control the gain thereof. Differential input signals to be amplified are applied to the + and − inputs of the first gain stage $\mathbf{20_1}$. Differential output signals are available from the last gain stage $\mathbf{20_n}$. The gain of the amplifier 10 is determined by an N bit digital word from a digital control system 12, such as a microprocessor or digital signal processor, without the need for an intervening digital-to-analog converter. As shown, the gain of the first gain stage $20_1$ and the last gain stage $20_n$ is controlled by digital data having I and M bits, respectively ($N \geqq I$, $N \geqq M$). It is noted that the number of bits may be different for each stage $20_1$–$20_n$ and bits may be shared among the different stages $20_1$–$20_n$ as required.

It may be desirable to have the first stage $20_1$ responsive to a single-ended (non-differential) input signal. To do so, it is preferable to bypass the unused input thereto with a bypass capacitor (not shown) and provide suitable biasing (not shown) to both inputs. Although all of the stages $20_1$–$20_n$ are shown as directly coupled, coupling capacitors (not shown) may be placed between the stages and suitable biasing applied to the inputs of the stages.

Figure 2:
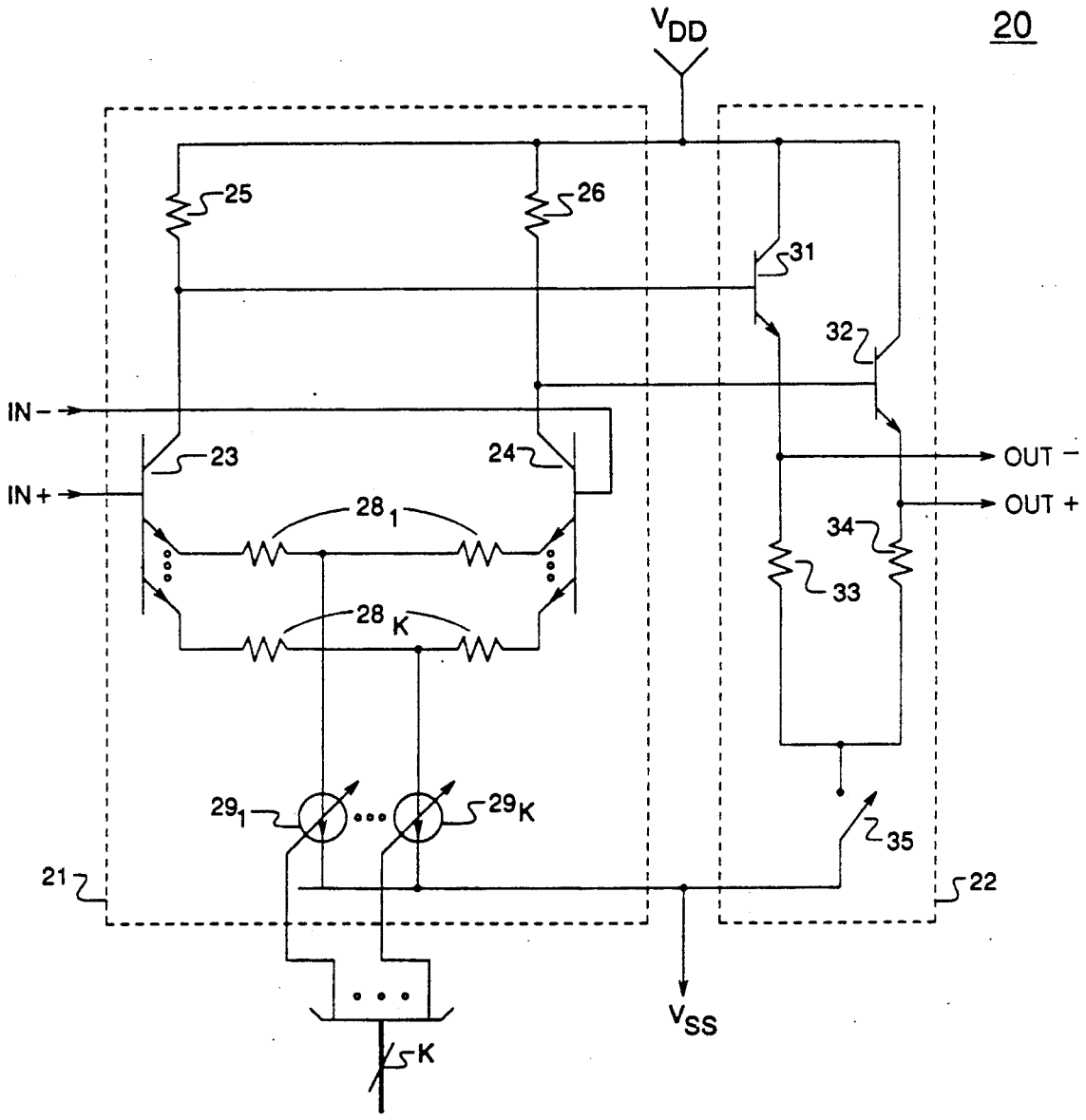
FIG. 2 is schematic diagram of an exemplary stage of the differential amplifier shown in FIG. 1; and, FIG. 3 is an exemplary, simplified schematic diagram of the switched current sources of FIG. 2.

An exemplary gain stage $20_1$–$20_n$ is shown in FIG. 2 as a gain stage 20. As shown, there are two states to a gain stage 20, the digitally controlled gain portion, 21 and a buffer 22, which will be discussed in more detail below. The digitally controlled gain portion 21 has a pair of transistors 23, 24, the bases thereof being driven by the differential input (IN+, IN−) of the stage 20. The collectors of transistors 23, 24 couple to the outputs (OUT+, OUT−) of the stage 20 via the buffer 22. In addition, load resistors 25, 26 couple to corresponding collectors of the transistors 23, 24. Resistor pair $28_1$–$28_K$ couple to the corresponding emitters of transistors 23,24 to substantially establish the gain of the stage 20, as will be discussed in more detail below. Switched current sources $29_1$–$29_K$, controlled by corresponding bits of the K bit digital input data, select which resistor pair $29_1$–$29_K$, or combination thereof, will substantially establish the gain of the stage 20. The gain of the stage 20 may then be approximately expressed as $R_L/R_E$, where $R_L$ is the resistance of resistor 25 or 26, $R_E$ is the combined resistance of one resistor of the resistor pairs $28_1$–$28_K$, having a corresponding current source $29_1$–$29_k$ being "on", in series with the emitter resistance, $r_e$. The value of $r_e$ is approximately $0.026/I_E$, at 273° K, where $I_E$ is the current flowing in the emitter of the transistor.

More particularly, the transistors 23, 24 form a differential pair driving load resistors 25, 26 which in turn couples to the power supply rail, $V_{DD}$. The transistors 23, 24 have multiple emitter contacts for coupling to corresponding resistor pairs $28_1$–$28_K$. It is understood that the transistors 23, 24, shown here as single transistors with multiple emitters, may be multiple transistors arranged to provide multiple emitters or improve the beta, output resistance, breakdown voltage, etc., or any combination thereof.

The common junction of the resistors in each resistor pair $28_1$–$28_K$ couples to the corresponding switched current source $29_2$–$29_K$. With substantially equal resistors in each pair of resistors $28_1$–$28_K$, the common junction of the resistor pair is at virtual ground, i.e., the voltage there does not change substantially with input signal. Further, to isolate those resistor pairs $28_1$–$28_K$ not having current flowing therein, the multiple emitters in transistors 23, 24 serve as reversed biased diodes, thereby making the gain of the stage 29 substantially dependent only on those resistor pairs with corresponding switched current sources $29_1$–$29_K$ turned "on". It is understood that multiple current sources $29_1$–$29_K$ may be "on" at any time, making the gain dependent on the combined resistances of the resistors in the current carrying resistor pairs. Should it be desirable to allow for multiple switched current sources $29_1$–$29_K$ to be "on" at any time, the current densities should be substantially the same in the current carrying emitters in transistors 23, 24. This may be achieved by either paralleling multiple emitters or adjusting the size of the emitter regions (not shown) as appropriate. Similarly, the current density in the emitter regions should be substantially the same if the switched current sources $29_1$–$29_K$ have different currents.

The switched current sources $29_1$–$29_K$, as will be discussed in more detail below, are preferably simple current mirrors with the current to each current mirror controlled by a switch, such as a selectively saturated transistor (not shown). The saturated transistor would be controlled by the corresponding bit of the K bit digital input word.

The buffer 22 has transistors 31 and 32 operating as emitter followers, with resistors 33, 34 as loads, respectively. The outputs OUT−, OUT+ of the stage 20 are coupled from the emitters of the transistors 31, 32, respectively. Buffer 22 then serves to isolate the digitally controlled gain portion 21 from a load (not shown) applied to the outputs OUT+, OUT−, thereby making the gain of the stage 20 substantially independent of the load. The gain of the buffer 22 is less than one.

To conserve power, the buffer 22 may be powered-down or disabled by opening switch 35, such as a selectively saturated transistor (not shown), and, if desired, turning off all the controlled current sources $29_1$–$29_K$.

The gain of the digitally controlled gain portion varies with temperature due to the changes in the resistances of resistors 25, 26, $28_1$–$28_K$ and the emitter resistance $r_e$, discussed above. To compensate for the temperature variations, the current from the switched current sources $29_1$–$29_K$ must vary accordingly.

Figure 3:
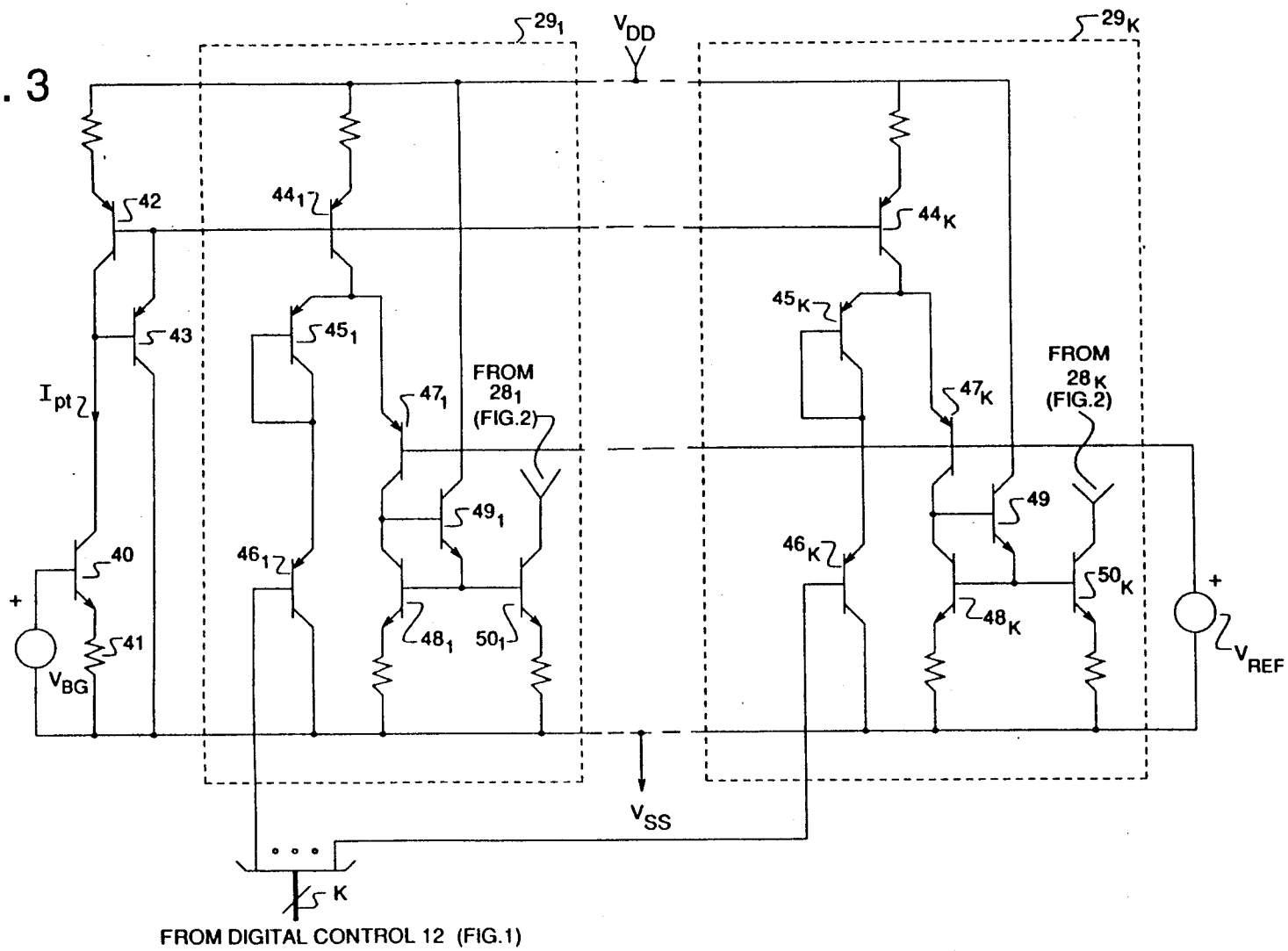

Referring to FIG. 3, an example of the switched current sources $29_1$–$29_K$ is shown in a simplified schematic. A voltage source $V_{BG}$, derived from a bandgap voltage reference, drives transistor 40, having a resistor 41 in the emitter thereof, to produce current $I_{pt}$. Resistor 41 is the same type as the resistors $28_1$–$28_K$, such that the temperature characteristics thereof are substantially the same. The bandgap reference $V_{BG}$ may be similar to those described on pages 289–296 of *Analysis and Design of Analog Integrated Circuits*, second edition, by P. R. Gray and R. G. Meyer, 1984. The temperature characteristics of $V_{BG}$ are adjusted such that the current $I_{pt}$ has a temperature coefficient to offset changes in the gain of digitally controlled gain portion 21 (FIG. 2) with temperature.

Operation of the exemplary switched current sources $29_1$–$29_K$ are all substantially the same and will be described using an exemplary one of the current sources, $29_1$. The current $I_{pt}$ drives transistor 42, with helper transistor 43, so that transistors $44_1$ proportionately mirrors the current $I_{pt}$. Current from transistor $44_1$ is switched between two paths, either through transistors $45_1$, $46_1$ or through transistors $47_1$, $48_1$ depending on the digital data from the digital control 12 (FIG. 1). Reference voltage $V_{ref}$, coupled to transistor $47_1$, sets the trip point of the switch, i.e., the voltage of the digital data at which the switch changes the current flow paths, as discussed above. When the current from transistor $44_1$ flows through transistor $48_1$ and helper transistor $49_1$, the current is mirrored by transistor $50_1$ and conducts current from corresponding resistor pair $28_1$ (FIG. 2).

It may be preferable to implement a gain stage 20 (FIG. 2) with the switched current sources $29_1$–$29_K$ adapted to provide complementary output currents, i.e., a switched current source would have two outputs, only one of which is conducting current at any time. This allows for one digital control bit to switch the gain of the stage 20 between two predetermined amounts. The exemplary switched current sources $29_1$–$29_K$ shown in FIG. 3 may be easily adapted to provide the complementary output currents.

It is noted that the disabling of all the switched current sources $29_1$–$29_K$ (FIG. 2) to conserve power, discussed above, may be accomplished by turning off the bandgap reference $V_{BG}$.

All of the current mirrors shown here are simple current mirrors with emitter resistors and helper transistors. It is understood that other current mirrors may be used, such as Wilson, cascode, or compound current mirrors.

The transistor conductivity types shown in the figures are exemplary and may be interchanged with a suitable change in power supply voltage polarity. In addition, field-effect transistors may be substituted for the bipolar transistors shown here, with suitable modification to the circuits, as well known in the art.

EXAMPLE

Component values for four exemplary gain stages 20 are provided below. With the following exemplary values for the components in the digitally controlled gain stage 21, the overall voltage gain of one overall stage 20 was switched from approximately 0 dB to +24 dB, 0 dB to +12 dB, 0 dB to +6 dB and 0 dB to +3 dB. All stages used two switched current sources $29_1$, $29_2$. Note that the gain of the buffer 22 is approximately 0.9. Placing each of these exemplary gain stages 20 in tandem, a 0 to +45 dB gain (in 3 dB increments) digitally controlled amplifier 10 (FIG. 1) was achieved.

| gain of Stage 20 | 24dB/0dB | 12dB/0dB | 6dB/0dB | 3dB/0dB |
|---|---|---|---|---|
| resistor 25, 26 (ohms) | 800,800 | 650,650 | 650,650 | 650,650 |
| resistor $28_1$ (ohms) | 633 | 533 | 533 | 550 |
| resistor $28_2$ (ohms) | 12.5 | 90 | 244 | 375 |
| current source $29_1$ | 1 mA | 1 mA | 1 mA | 1 mA |
| current source $29_2$ | 2 mA | 1 mA | 1 mA | 1 mA |

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. An amplifier having a plurality of gain stages connected in tandem, the gain of each stage being controlled by digital input signals, each gain stage characterized by:

at least one transistor having multiple emitters;

a plurality of resistors, coupling to corresponding emitters; and, means, coupling to the plurality of resistors, for enabling current through selected ones of the plurality of resistors in response to the digital input signals;

wherein the gain of the gain stage is substantially determined by the resistances of the plurality of resistors having current flowing therein.

2. The amplifier as recited in claim 1, wherein the means is a plurality switched current sources corresponding to the resistors.

3. The amplifier as recited in claim 2, wherein the gain stages are differential gain stages.

4. A differential amplifier, disposed in an integrated circuit, having differential inputs, differential outputs, and digitally selectable gain, characterized by:

first and second transistors, each having an input and first and second outputs, the inputs coupling to corresponding differential inputs of the gain stage and first outputs coupling to differential outputs of the gain stage;

first and second load resistors, having substantially equal resistances, coupling to corresponding collectors of first and second transistors;

a plurality of pairs of gain-setting resistors, the resistors in each pair having substantially equal resistances, each resistor of each pair coupling to corresponding second outputs of the first and second transistors, for setting the gain of the gain stage; and, switched current sources for selectively conducting current from the corresponding pair of gain-setting resistors;

wherein the gain of the stage is determined substantially by the ratio of the resistance of the load resistors to the combined resistance of the gain-setting resistors having current therein.

5. The differential amplifier as recited in claim 4, wherein the first and second transistors have multiple emitters and the gain-setting resistors couple to the corresponding emitters.

6. The differential amplifier as recited in claim 5, wherein only one of the switched current sources operates at a time.

7. The differential amplifier as recited in claim 5, further characterized by a buffer amplifier disposed between the differential outputs of the amplifier and the first outputs of the first and second transistors.

8. The differential amplifier as recited in claim 7, wherein the buffer amplifier is an emitter follower.

* * * * *